(12) United States Patent
Nishina

(10) Patent No.: US 6,950,644 B2
(45) Date of Patent: Sep. 27, 2005

(54) SATELLITE BROADCAST RECEIVING DEVICE HAVING TWO LOCAL OSCILLATION CIRCUITS AND REDUCED SPURIOUS SIGNAL

(75) Inventor: Motohisa Nishina, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 34 days.

(21) Appl. No.: 10/078,710

(22) Filed: Feb. 21, 2002

(65) Prior Publication Data
US 2002/0113664 A1 Aug. 22, 2002

(30) Foreign Application Priority Data
Feb. 21, 2001 (JP) .................................. 2001-044707

(51) Int. Cl.$^7$ ................................................ H04B 1/10
(52) U.S. Cl. ........................ 455/318; 455/315; 333/12
(58) Field of Search .................... 333/12, 181; 455/327, 455/323, 315, 317, 318

(56) References Cited

U.S. PATENT DOCUMENTS

| | | | |
|---|---|---|---|
| 4,353,132 A | * | 10/1982 | Saitoh et al. ............... 455/315 |
| 4,607,394 A | * | 8/1986 | Nightingale ................ 455/327 |
| 5,584,064 A | * | 12/1996 | Nakamura ................... 455/293 |
| 5,630,226 A | * | 5/1997 | Kanda et al. ................ 455/313 |
| 6,081,996 A | * | 7/2000 | Kruppa et al. ................ 29/840 |
| 6,472,958 B2 | * | 10/2002 | Nakamura ................... 333/181 |
| 6,522,872 B1 | * | 2/2003 | Nishimura et al. .......... 455/301 |

FOREIGN PATENT DOCUMENTS

| | | |
|---|---|---|
| JP | 2-133033 U | 11/1990 |
| JP | 08-316856 A | 11/1996 |
| JP | 10-233705 A | 9/1998 |

* cited by examiner

Primary Examiner—Benny Lee
(74) Attorney, Agent, or Firm—Birch, Stewart, Kolasch, & Birch, LLP

(57) ABSTRACT

A first printed circuit board is attached to an upper surface of a chassis, and a second printed circuit board is attached to a lower surface of the chassis. The chassis has a thickness of a certain degree, which can reduce a mutual effect of first and second local oscillators, and can suppress occurrence of a spurious signal. Thus, a satellite broadcast receiving device can be provided in which the mutual effect of two local oscillating circuits can be reduced and thus occurrence of a spurious signal is suppressed.

9 Claims, 7 Drawing Sheets

SATELLITE BROADCAST RECEIVING DEVICE HAVING TWO LOCAL OSCILLATION CIRCUITS AND REDUCED SPURIOUS SIGNAL

BACKGROUND OF THE INVENTION

1. Field of the Invention

The present invention relates to a satellite broadcast receiving device, and more particularly, to a satellite broadcast receiving device having a circuit therein, in which two or more local oscillation circuits are simultaneously operated, in a low noise down-converter (LNB) used in satellite communication.

2. Description of the Background Art

A coaxial cable is generally used to direct a signal from a receiving antenna for satellite broadcasting to an indoor BS tuner. However, the coaxial cable cannot directly guide the radio wave received by the antenna to the indoor BS tuner.

It is required to use a metal tube called a waveguide in order to guide the radio wave in satellite broadcasting, which has a very high frequency. The use of the waveguide requires a big hole opened on a wall to guide a signal from the antenna to an indoor satellite receiver and also generates a large amount of attenuation, which makes it impractical. Thus, generally, an LNB installed near the antenna is used to reduce the frequency of a received signal to a frequency at a degree such that it can be guided by the coaxial cable, and to transmit the signal to an indoor satellite receiver. The indoor satellite receiver has a scramble decoder therein, which descrainbles the signal, and an image is displayed on a display machine.

Under circumstances where both analog and digital broadcasting exist, a broadband LNB is required to receive the both types of signals. A local oscillation circuit is used for converting a signal received from a satellite into a signal in a band that can be received by a satellite receiver on the ground. However, the band for the signal received from the satellite is broader than an output band of one local oscillation circuit. Therefore, two local oscillation circuits having different oscillation frequencies are generally used for reception.

For example, for the band of 10.7 to 11.7 GHz of the signal received from the satellite, the first local oscillation circuit having an oscillation frequency of 9.75 GHz is used to cover a frequency of 950 to 1950 MHz output from the LNB. Moreover, for the band of 11.7 to 12.75 GHz of the received signal, the second local oscillation circuit having an oscillation frequency of 10.6 GHz is used to cover a frequency of 1100 to 2150 MHz output from the LNB.

In the LNB structure, conventionally, two printed circuit boards were used, each of which were provided with one local oscillation circuit, to avoid the local oscillation circuits interfering with each other.

FIG. 10 shows a sectional structure of a conventional satellite broadcast receiving device.

Referring to FIG. 10, a board 234 is attached to one side of a sheet metal 246 having a thickness of d1, and a board 236 is attached to the other side thereof. Local oscillation circuits 212 and 218 are mounted on boards 234 and 236, respectively. A frame 242 is attached to cover board 234. Whereas, board 236 is covered by a chassis 232.

Conventionally, sheet metal 246 separated board 234 from board 236. The thickness of sheet metal 246 was, for example, approximately 2 mm. However, this could not keep a sufficient distance between the two boards.

Thus, when the two local oscillation circuits are simultaneously operated, a strong spurious signal is generated and a harmonic wave appears within a receiving band. The harmonic wave affects a signal from the satellite so that the signal cannot be normally transmitted to an indoor satellite broadcast receiver or the like, resulting in possible distortion of a picture on a television screen or the like.

FIG. 11 illustrates an arrangement of a contact pin 262 on board 236 in FIG. 10.

Referring to FIG. 11, in the conventional satellite broadcast receiving device, contact pin 262 is provided on board 236 in the vicinity of local oscillation circuit 218 including a dielectric resonator 272. By contact pin 262, local oscillation circuit 218 mounted on board 236 in FIG. 10 is supplied with a power potential from a power-supply circuit (not shown) on board 234.

FIG. 12 illustrates the shape of the conventional contact pin 262.

Referring to FIG. 12, an insulator 264 made of resin is attached in a middle portion of the rod-like contact pin 262 to determine the position with respect to the board.

FIG. 13 is a section view of a region around which contact pin 262 connects boards 234 and 236. Boards 234 and 236 are separated by metal chassis 246.

Referring to FIG. 13, insulator 264 made of resin is attached to the contact pin when the pin is connected to boards 234 and 236 by soldering or the like, to prevent contact pin 262 from falling off the board. When contact pin 262 is attached to resin 264, the position varies at which the resin is attached with respect to the pin. This causes variations of length D1 of contact pin 262 protruding from the boards. Moreover, some margin is required for the length of the pin in order to cover such variations, resulting in further increase of length D1 of the pin protruding from the boards.

As length D1 of the pin protruding from the boards is increased, the circuit becomes more susceptible to the radio wave, and thus a spurious signal easily occurs due to a mutual effect of the two local oscillation circuits attached to boards 234 and 236 respectively.

SUMMARY OF THE INVENTION

An object of the present invention is to provide a satellite broadcast receiver that can reduce as much as possible the level of a spurious signal generated when two local oscillation circuits are simultaneously operated, and that down-converts a normal signal from a satellite without interference to send the signal to an indoor satellite broadcast receiver and the like.

According to one aspect of the present invention, a satellite broadcast receiving device includes a chassis, a first printed circuit board, a first local oscillation circuit, a second printed circuit board, and a second local oscillation circuit.

The chassis is made of metal, and has opposing first and second planes. The first printed circuit board is attached to the first plane of the chassis. The first local oscillation circuit is provided on the first printed circuit board. The second printed circuit board is attached to the second plane of the chassis. The second local oscillation circuit is provided on the second printed circuit board. The second local oscillation circuit is shielded by the metal chassis to be separated from the first local oscillation circuit.

Therefore, a main advantage of the present invention is that the spurious signal which is generated due to the use of two local oscillation circuits is eliminated or reduced, so that a normal signal from a satellite can be transmitted to a satellite broadcast receiver and the like having a scramble decoder, without the signal being interfered.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
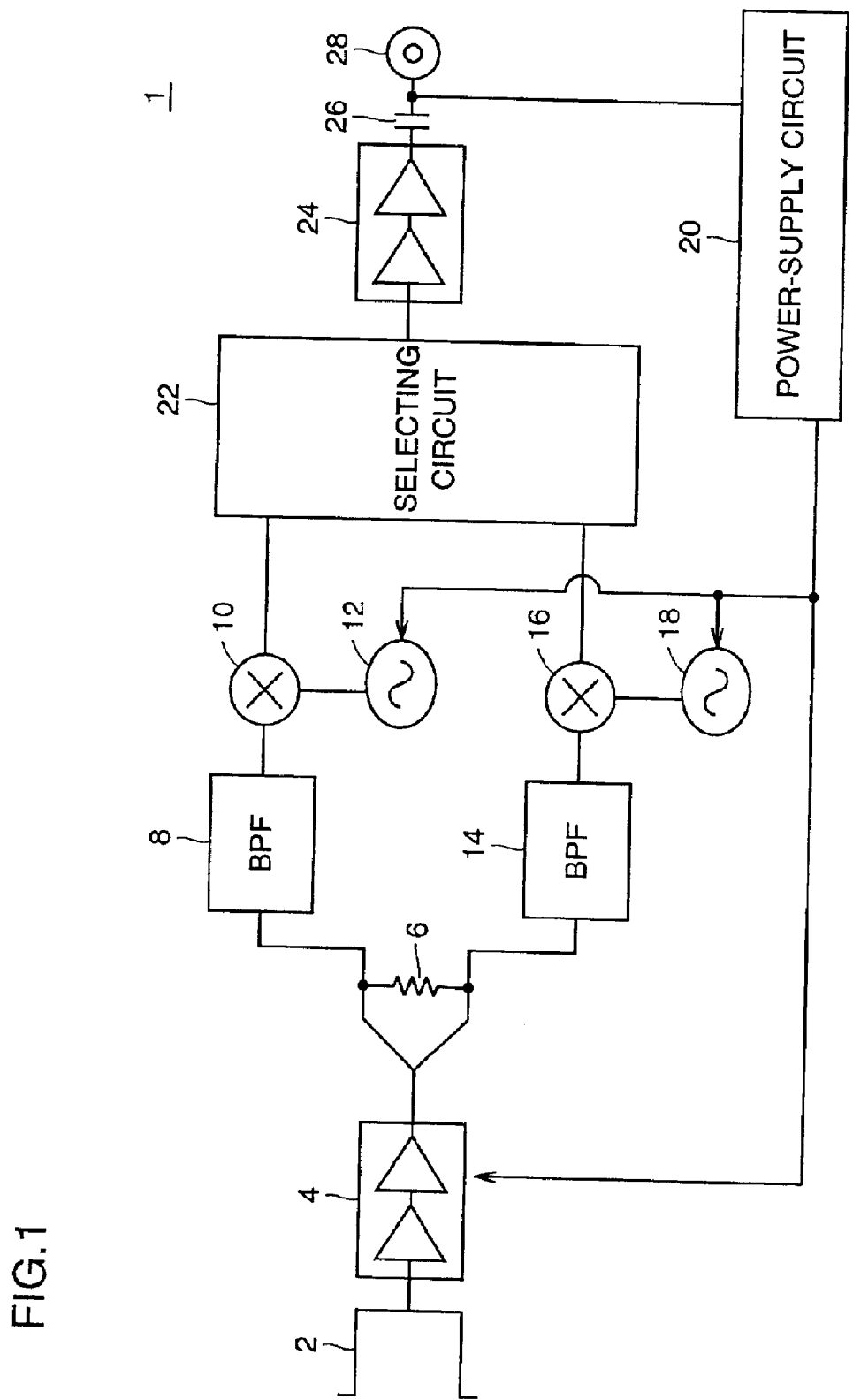
FIG. 1 is a block diagram showing the configuration of an LNB which is a satellite broadcast receiving device according to the present invention.

An embodiment of the present invention will be described below in detail with reference to the drawings. It is noted that the same reference characters in the drawings denote the same or corresponding portions.

FIG. 1 is a block diagram showing the configuration of an LNB which is a satellite broadcast receiving device according to the present invention.

Referring to FIG. 1, a satellite broadcast receiving device 1 includes a power-supply circuit 20, an input horn 2 receiving a signal from a satellite, a low noise amplifier (LNA) 4 amplifying an output of input horn 2, a band pass filter (BPF) 8 connected to an output of LNA 4, a local oscillation circuit 12 outputting a predetermined first local oscillation frequency, and a mixer 10 mixing an output of band pass filter 8 and an output of local oscillation circuit 12.

Satellite broadcast receiving device 1 further includes a register 6, a band pass filter 14 connected to the output of LNA 4, a local oscillation circuit 18 outputting a second predetermined local oscillation frequency, a mixer 16 mixing an output of band pass filter (BPF) 14 and an output of local oscillation circuit 18, a selecting circuit 22 selecting one of the outputs of mixer 10 and 16, an IF amplifier 24 amplifying an output of selecting circuit 22, a capacitor 26 with one end thereof connected to an output of IF amplifier 24, and an F-type connector 28 connected to the other end of capacitor 26.

LNA 4, local oscillation circuits 12 and 18 are supplied with an internal power-supply potential from power-supply circuit 20 which receives an external power supply potential through F-type connector 28.

Figure 2:
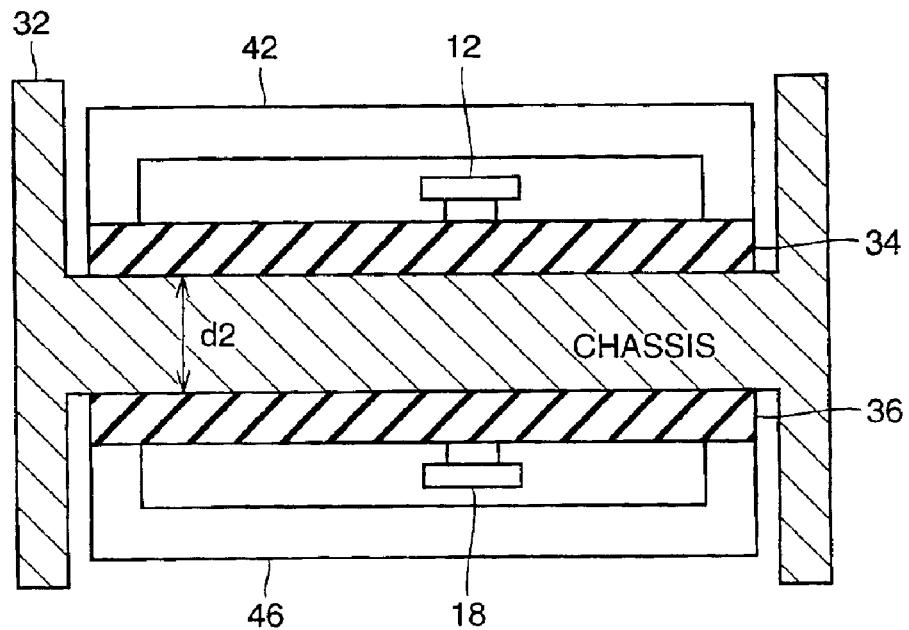
FIG. 2 is a sectional view schematically showing a structure of the satellite broadcast receiving device according to the present invention, in which boards having two local oscillation circuits respectively mounted thereon are separated.

FIG. 2 is a section view schematically showing a structure of the satellite broadcast receiving device according to the present invention, in which boards having two local oscillation circuits respectively mounted thereon are separated.

Referring to FIG. 2, boards 34 and 36 are attached to upper and lower surfaces of a chassis 32, respectively. Local oscillation circuits 12 and 18 are mounted on boards 34 and 36, respectively. A frame 42 is attached to cover board 34. A frame 46 is attached to cover board 36.

Figure 10:
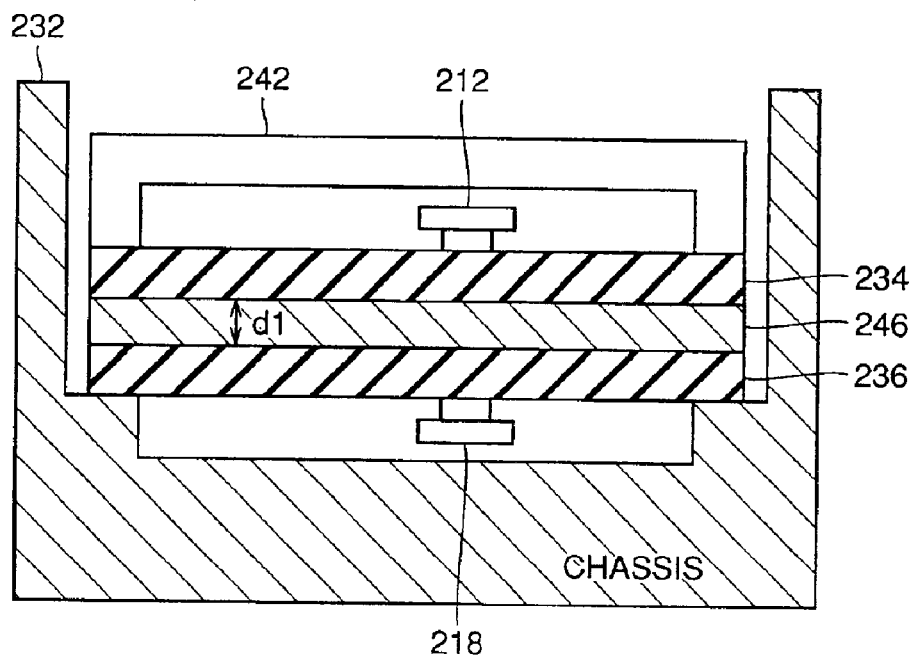
FIG. 10 shows a sectional structure of the conventional satellite broadcast receiving device.
Figure 11:
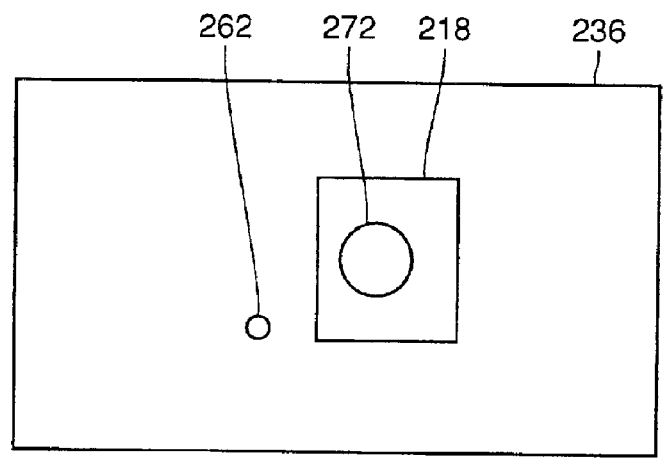
FIG. 11 illustrates an arrangement of contact pin 262 on board 236 in FIG. 10.
Figure 12:
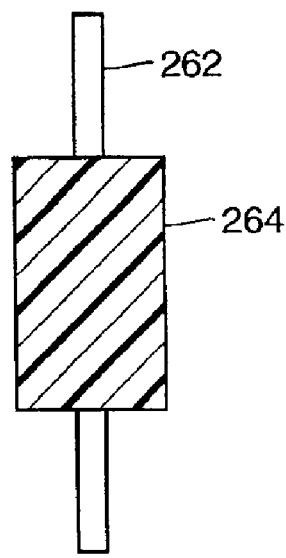
FIG. 12 illustrates the shape of the conventional contact pin 262.
Figure 13:
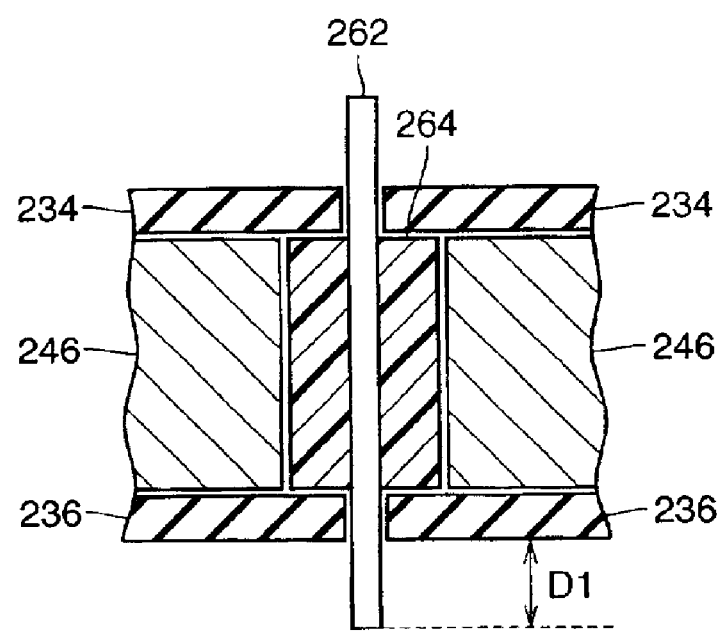
FIG. 13 is a sectional view showing a portion around which contact pin 262 connects boards 234 and 236.

This structure is different from the conventional structure shown in FIG. 10 in that boards 34 and 36 are respectively attached to both sides of the chassis that is required to be relatively thick in order to have rigidity. In the conventional structure depicted in FIG. 10, though board 234 and board 236 were separated by sheet metal 246, the sheet metal has a small thickness of d1. Thus, the two local oscillation circuits arranged on boards 234 and 236 respectively are arranged so close to each other that the circuits may easily interfere with each other. In the structure shown in FIG. 2, a sufficient distance d2 is secured by the metal chassis, so that the mutual interference of the local oscillation circuits can be suppressed.

To be more specific, conventionally, boards 234 and 236 are separated by sheet metal 246 as described with reference to FIG. 10. Sheet metal 246 has a thickness of approximately 2 mm, while the chassis portion in FIG. 2 is formed to have thickness d2 of e.g. approximately 7 mm, achieving an effect of reducing the spurious level.

Figure 3:
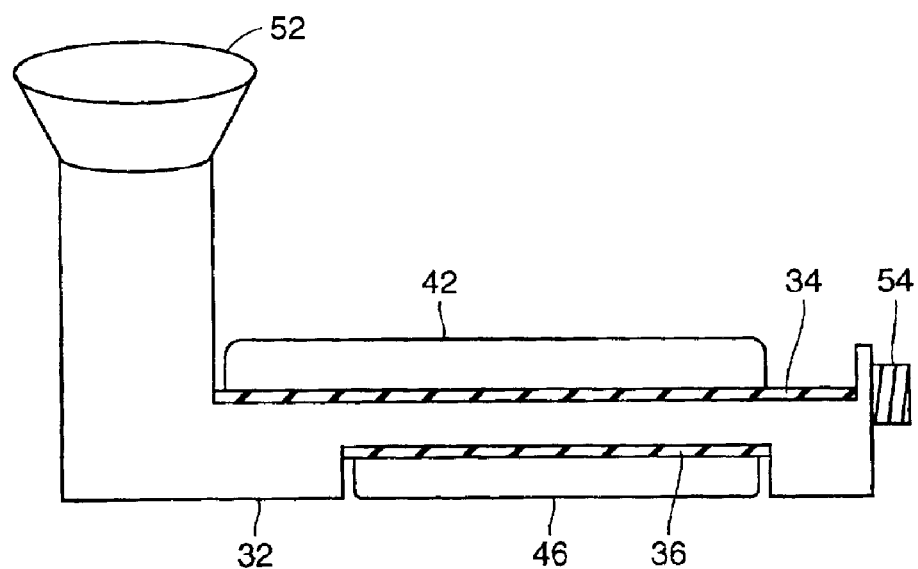
FIG. 3 is a side view of the structure of the satellite broadcast receiving device according to the present invention.

FIG. 3 is a side view of the structure of the LNB which is a satellite broadcast receiving device according to the present invention.

Referring to FIG. 3, an input horn 52 is attached to chassis 32, and a board 34 is attached to an upper surface of chassis 32. Frame 42 is attached to cover board 34. Board 36 is attached to a lower surface of chassis 32. Frame 46 is attached to cover board 36. F-type connector 54 is further attached to chassis 32 to output a signal to an indoor satellite broadcast receiver.

As such, board 34 and board 36 are separated by a metal shield of chassis 32 and each circuit on each board are covered with a frame to be partitioned, such that radio wave is prevented from leaking outside of the chassis.

Figure 4:
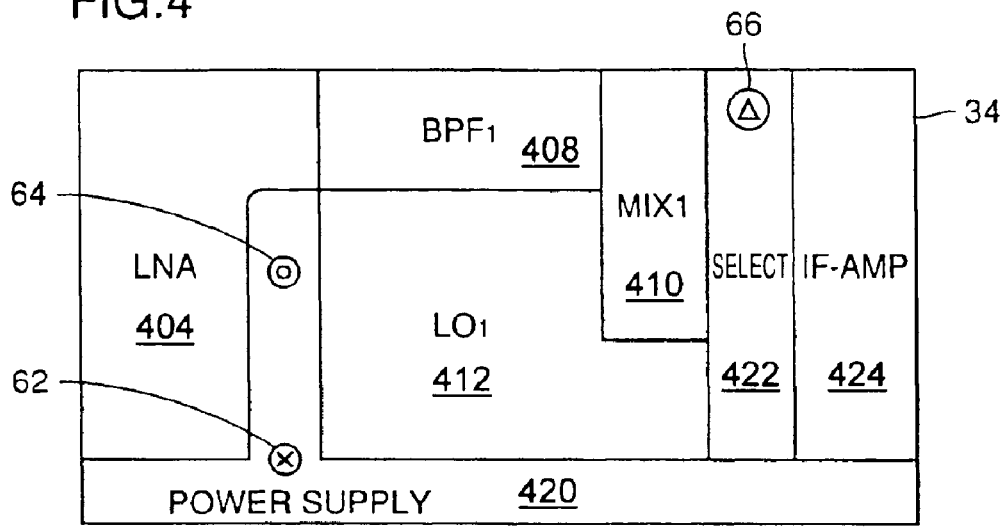
FIG. 4 shows a circuit arrangement provided on a board 34.

FIG. 4 shows an arrangement of circuits provided on board 34.

Referring to FIG. 4, board 34 is provided with a region LNA 404 in which LNA 4 is arranged, a region BPF1 408 in which band path filter 8 is arranged, a region LO1 412 in which local oscillation circuit 12 is arranged, a region MIX1 410 in which mixer 10 is arranged, a region SELECT 422 in which selecting circuit 22 is arranged, a region IF-AMP 424 in which IF amplifier 24 is arranged, a region POWERSUPPLY 420 in which power-supply circuit 20 is arranged.

Region POWERSUPPLY 420 is provided with contact pins 62 and 64. Region SELECT 422 in which the selecting circuit is arranged is provided with a contact pin 66. Contact pin 64 is provided for an RF signal. Contact pin 62 is provided for connection to a power-supply line. Contact pin 66 is provided for an IF signal.

Figure 5:
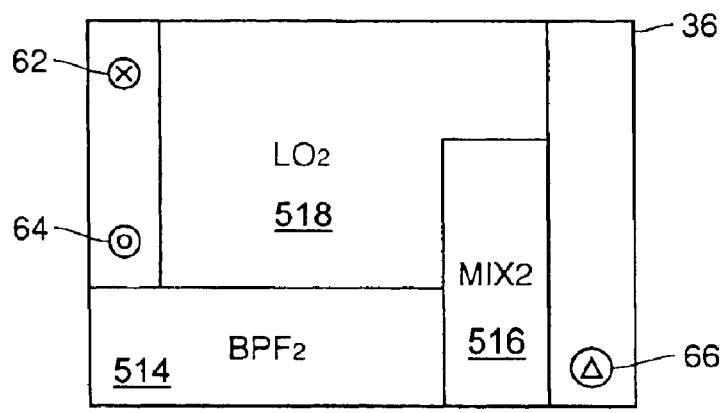
FIG. 5 shows a circuit arrangement of a board 36 on which the second local oscillation circuit is mounted.

FIG. 5 shows a circuit arrangement of board 36 on which the second local oscillation circuit is mounted.

Referring to FIG. 5, board 36 is provided with a region BPF2 514 in which band pass filter 14 is arranged, a region LO2 518 in which local oscillation circuit 18 is arranged, and a region MIX2 516 in which mixer 16 is arranged. Moreover, contact pin 62 for receiving power-supply, contact pin 64 for receiving an RF signal from the board 34 side, and a contact pin 66 for returning an IF signal to board 34.

Thus, a signal transmitted from board 34 via contact pin 64 to board 36 is narrowed to have only a required band by band path filter 14 in region BPF2 514. The narrowed signal is converted into an IF signal by local oscillation circuit 18 in region LO2 518 and mixer 16 in region MIX2 516. The IF signal is input into selecting circuit 22 on board 34 via contact pin 66.

In addition, a power-supply for actuating local oscillation circuit 18 is supplied from board 34 to board 36 via contact pin 62.

Figure 6:
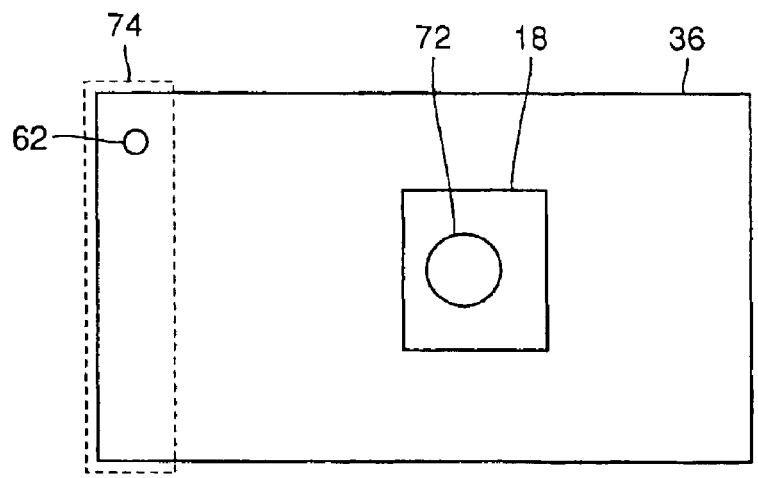
FIG. 6 illustrates an arrangement of a contact pin 62 on board 36.

FIG. 6 illustrates an arrangement of contact pin 62 on board 36.

Referring to FIG. 6, according to the present invention, contact pin 62 is arranged in a peripheral region 74 with a longer distance from local oscillation circuit 18 including dielectric resonator 72, compared to the conventional example. This can suppress radio wave in local oscillation leaking onto contact pins.

Figure 7:
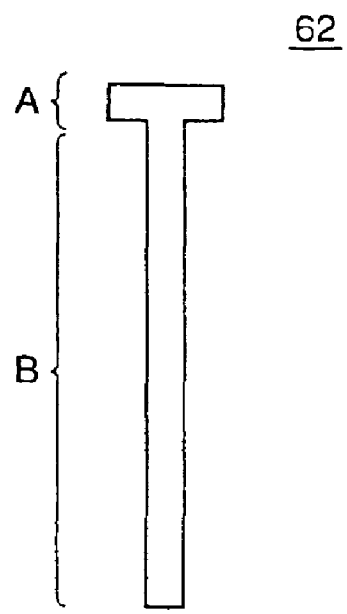
FIG. 7 shows a shape of contact pin 62.

FIG. 7 shows a shape of contact pin 62.

Referring to FIG. 7, contact pin 62 includes a shaft portion B, and a head portion A having a diameter larger than that of shaft portion B.

Figure 8:
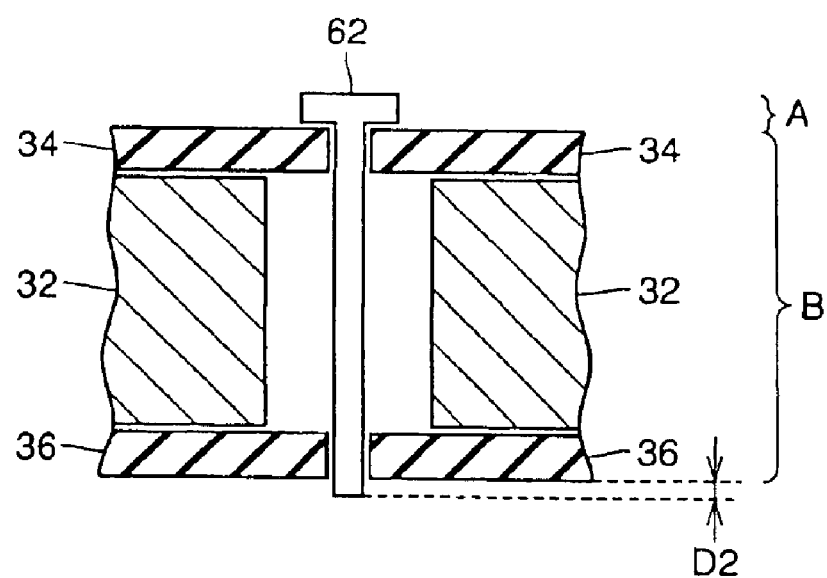
FIG. 8 is a sectional view showing a section of a portion where a contact pin connects boards with each other.

FIG. 8 is a sectional view showing a section of a portion where a contact pin connects boards with each other.

Referring to FIG. 8, boards 34 and 36 attached to chassis 32 are provided with holes for contact pin 62 to penetrate therethrough. The diameter of each of the holes is larger than the diameter of the shaft portion B of contact pin 62, and is smaller than the diameter of head portion A. It is noted that chassis 32 is provided with a hole having a diameter larger than that of each hole provided at boards 34 and 36. Conventionally, an insulator was attached on the periphery of the pin for fixing the pin to boards 34 and 36. However, in the present invention, head portion A of pin 62 is hooked on board 34 so as to be fixed in its position, so that no insulator is particularly required on the periphery of the pin.

With the conventional pin, a resin insulator was attached on the periphery of the pin to prevent the pin from falling off the boards, causing easy variations in the length of the pin protruding from the board, and thus the length of the pin protruding from the board was longer in order to provide a margin to cover such variations.

On the other hand, by using a pin having a head portion on one side as in the present embodiment, the length of the pin protruding from the board can be reduced. Moreover, the pin is fixed on one side, which causes less variations, so that the length of the pin can be shortened and also length D2 of the pin protruding from the board can be reduced.

Figure 9:
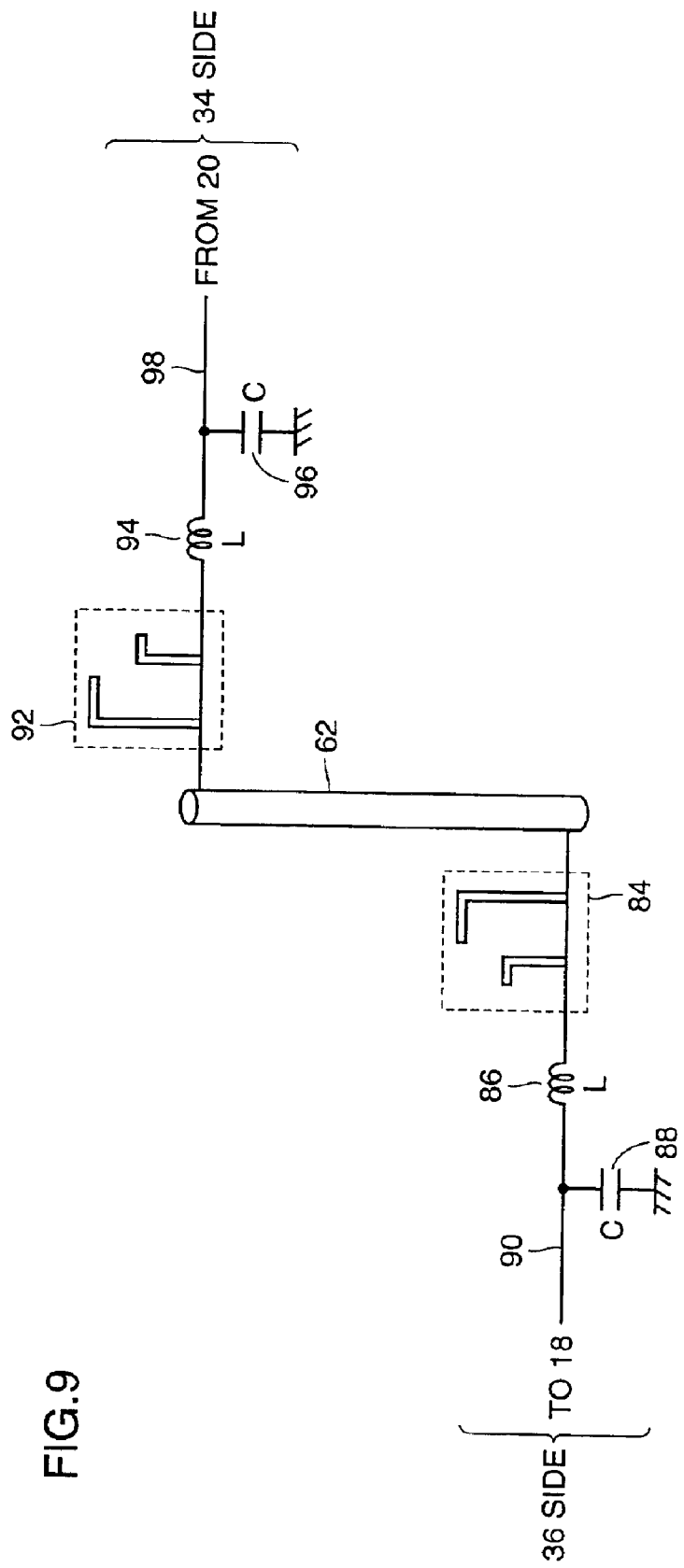
FIG. 9 illustrates a circuit on a power-supply line connected to contact pin 62 provided for connection to a power-supply.

FIG. 9 illustrates circuits on a power-supply line, which are connected to contact pin 62 provided for connection to power-supply.

Referring to FIG. 9, a power-supply line 90 arranged on board 36, to which contact pin 62 is connected, is provided with a trap 84 for reducing a local frequency and a local harmonic wave in the vicinity of contact pin 62, and a coil L 86 and a capacitor C 88 constituting a low pass filter blocking passage of a signal equal to or higher than 1 GHz in order to prevent passage of excess radio wave.

A power-supply line 98 provided on board 34, to which the other end of contact pin 62 is connected, is similarly provided with a trap 92, a coil L 94 and a capacitor C 96 constituting a low pass filter blocking passage of a signal equal to or higher than 1 GHZ. A power current is supplied from power supply circuit 20 to power-supply line 98 and the power current is supplied from power-supply line 90 to local eoscillation circuit 18.

In the example shown in FIG. 9, a pattern having an L-shape is provided as an example of a trap. Such an L-shaped pattern is used as one method of the trap (i.e., 84 or 92) eliminating an undesirable signal, which can eliminate a signal in the vicinity of a certain frequency depending on its length.

Provision of the structure shown in FIG. 9 in the vicinity of the contact pin can eliminate and reduce excess radio wave being transmitted via the power-supply lines to the other circuit portions.

As described above, local frequency and local harmonic wave transmitting onto the contact pin that connects the boards can be suppressed, and even if such frequency waves are applied over the contact pin, transmission thereof via the power-supply lines to the other circuits can be prevented, so that occurrence of a spurious signal can be suppressed.

According to the present invention, a spurious signal sent via a power-supply line within an LNB can be eliminated or reduced, so that a normal signal can be transmitted to a satellite broadcast receiver or the like having a scramble decoder therein, without the signal from a satellite being interfered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A satellite broadcast receiving device, comprising:
   a chassis made of metal having opposing first and second planes;
   a first printed circuit board attached to said first plane;
   a first local oscillation circuit provided on said first printed circuit board;
   a second printed circuit board attached to said second plane; and
   a second local oscillation circuit provided on said second printed circuit board,
   said second local oscillation circuit being shielded from said first local oscillation circuit and said metal chassis is of sufficient thickness between said first and second planes such that a spurious signal due to the two local oscillation circuits is substantially eliminated.

2. The satellite broadcast receiving device according to claim 1, wherein
   a distance between said first and second planes is at least 7 mm.

3. The satellite broadcast receiving device according to claim 1, wherein
   said second local oscillation circuit is supplied with a power-supply potential generated from a power supply circuit on said first printed circuit board, said chassis is provided with a first hole penetrating from said first plane to said second plane, said first printed circuit board is provided with a second hole, said second printed circuit board is provided with a third hole in a peripheral region, along a furthest one of sides of said second board with respect to said second local oscillation circuit, and said satellite broadcast receiving device further comprises a contact pin penetrating through said first, second and third holes to supply said power-supply potential from said power supply circuit on said first printed circuit board to said second local oscillation circuit.

4. The satellite broadcast receiving device according to claim 3, further comprising:

a first power-supply line provided on said first printed circuit board to supply said power-supply potential from said power-supply circuit to said first local oscillation circuit and to said contact pin;

a first trap portion provided on said first power-supply line to be adjacent to said contact pin, to eliminate the spurious signal;

a second power-supply line provided on said second printed circuit board to supply said power-supply potential from said contact pin to said second local oscillation circuit; and a second trap portion provided on said second power-supply line to be adjacent to said contact pin, to eliminate the spurious signal.

5. The satellite broadcast receiving device according to claim 4, wherein said first trap portion includes an L-shaped first printed wiring pattern having one end connected to said first power-supply line, and said second trap portion includes an L-shaped second printed wiring pattern having one end connected to said second power-supply line.

6. The satellite broadcast receiving device according to claim 2, further comprising:

a first power-supply line provided on said first printed circuit board to supply said power-supply potential from said power-supply circuit to said first local oscillation circuit and to said contact pin;

a first low pass filter provided on said first power-supply line to be adjacent to said contact pin, to block passage of a signal having a frequency equal to or greater than 1 GHz;

a second power-supply line provided on said second printed circuit board to supply said power-supply potential from said contact pin to said second local oscillation circuit; and a second low pass filter provided on said second power-supply line to be adjacent to said contact pin, to block passage of a signal having a frequency equal to or greater than 1 GHz.

7. The satellite broadcast receiving device according to claim 6, wherein said first low pass filter includes a first inductance having one end connected to said first power-supply line and the other end connected to said contact pin, and a first capacitor connected between said one end of said first inductance and a ground node; and said second low pass filter includes a second inductance having one end connected to said second power-supply line and the other end connected to said contact pin, and a second capacitor connected between said one end of said second inductance and the ground node.

8. The satellite broadcast receiving device according to claim 3, wherein said contact pin includes a shaft portion having a diameter smaller than a diameter of said second hole and a diameter of said third hole, and a head portion disposed on one end of said shaft portion and having a diameter larger than the diameter of said second hole and the diameter of said third hole.

9. The satellite broadcast receiving device according to claim 8, wherein said shaft portion protrudes from the second printed circuit board to an extent that said spurious signal due to the two local oscillation circuits is precluded.

* * * * *